United States Patent
Yoshikawa et al.

(10) Patent No.: US 6,198,415 B1
(45) Date of Patent: Mar. 6, 2001

(54) SERIAL-TO-PARALLEL CONVERTER

(75) Inventors: Takefumi Yoshikawa; Toru Iwata, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/365,882

(22) Filed: Aug. 3, 1999

(30) Foreign Application Priority Data

Aug. 4, 1998 (JP) .................................................. 10-220045

(51) Int. Cl.⁷ ...................................................... H03M 9/00
(52) U.S. Cl. ................................................................ 341/100
(58) Field of Search ...................................... 341/100, 101

(56) References Cited

U.S. PATENT DOCUMENTS

| | | | |
|---|---|---|---|
| 6,052,073 | * | 4/2000 | Carr et al. ............................. 341/100 |
| 6,121,906 | * | 9/2000 | Kim ....................................... 341/100 |

FOREIGN PATENT DOCUMENTS 61087416   5/1986   (JP) .
08316831   11/1996  (JP) .

* cited by examiner

*Primary Examiner*—Brian Young
(74) *Attorney, Agent, or Firm*—McDermott, Will & Emery

(57) ABSTRACT

A control voltage is supplied from a phase locked loop (PLL), which includes a phase detector and a voltage controlled oscillator (VCO), to a delay circuit. The VCO is made up of a plurality of inverters connected together in a ring. The control voltage is also supplied to each of these inverters so as to control an oscillation frequency of the VCO. The control voltage is defined based on a phase difference between a reference clock signal and an oscillation clock signal. The delay circuit is made up of a plurality of inverters connected in series to each other. A delay caused by each of these inverters is controlled with the same voltage as the control voltage. A serial signal is input to an initial-stage one of the inverters. A latch circuit latches the output signals of the respective inverters of the delay circuit in response to a latch clock signal, which has been generated by dividing the frequency of the reference clock signal. And based on a result of latching, a parallel signal is output.

12 Claims, 4 Drawing Sheets

SERIAL-TO-PARALLEL CONVERTER

BACKGROUND OF THE INVENTION

The present invention relates to a serial-to-parallel converter (SPC) for converting a serial signal with a predetermined bit rate into a parallel signal with a predetermined bit width.

A conventional SPC includes a shift register and a latch circuit. A shift register is made up of a plurality of flip-flops (FF) connected in series to each other. A serial signal with a predetermined bit rate is input to an initial-stage FF. In response to a common shift clock signal at a frequency matched with the bit rate of the serial signal, each FF operates to forward its input signal to an FF on the next stage. On the other hand, responsive to a latch clock signal at a frequency lower than that of the shift clock signal, the latch circuit latches the respective output signals of the FFs at a time, thereby outputting a parallel signal based on the results of latching.

In the conventional SPC, if the bit rate of the serial signal is very high, however, the shift register might operate erroneously. For example, if the bit rate of the serial signal is 1 Gbps, then each FF included in the shift register should operate at a very high speed in response to a shift clock signal with a frequency as high as 1 GHz. Accordingly, it is difficult to prevent the shift register from operating erroneously.

SUMMARY OF THE INVENTION

An object of the present invention is providing a highly reliable SPC that can operate at a high speed without using a shift register.

To achieve this object, the present invention uses a voltage controlled oscillator (VCO) included in a phase locked loop (PLL), connects a plurality of delay devices associated with the VCO in series to each other, and inputs a serial signal to an initial-stage one of the delay devices.

Specifically, an SPC according to the present invention includes a PLL, a delay circuit and a latch circuit. The PLL includes: a VCO having a plurality of logical elements connected together in a ring; and a phase detector for supplying a control voltage to each of these logical elements of the VCO to control the oscillation frequency of the VCO. The control voltage is defined based on a phase difference between a reference clock signal and an oscillation signal of the VCO. The delay circuit is made up of a plurality of delay devices connected in series to each other. A delay caused by each of these delay devices is controlled with the same voltage as the control voltage applied to the VCO. The serial signal is input to an initial-stage one of these delay devices. The latch circuit latches part or all of the output signals of the delay devices of the delay circuit in response to a latch clock signal and outputs a parallel signal based on a result of latching.

These delay devices, each causing just a short delay, are easily implementable. In addition, it is not necessary to supply a shift clock signal to these delay devices. According to the present invention, the delay caused by each of these delay devices can be precisely controlled with the same voltage as the control voltage applied to each of the logical elements in the VCO.

DETAILED DESCRIPTION OF THE INVENTION

Figure 1:
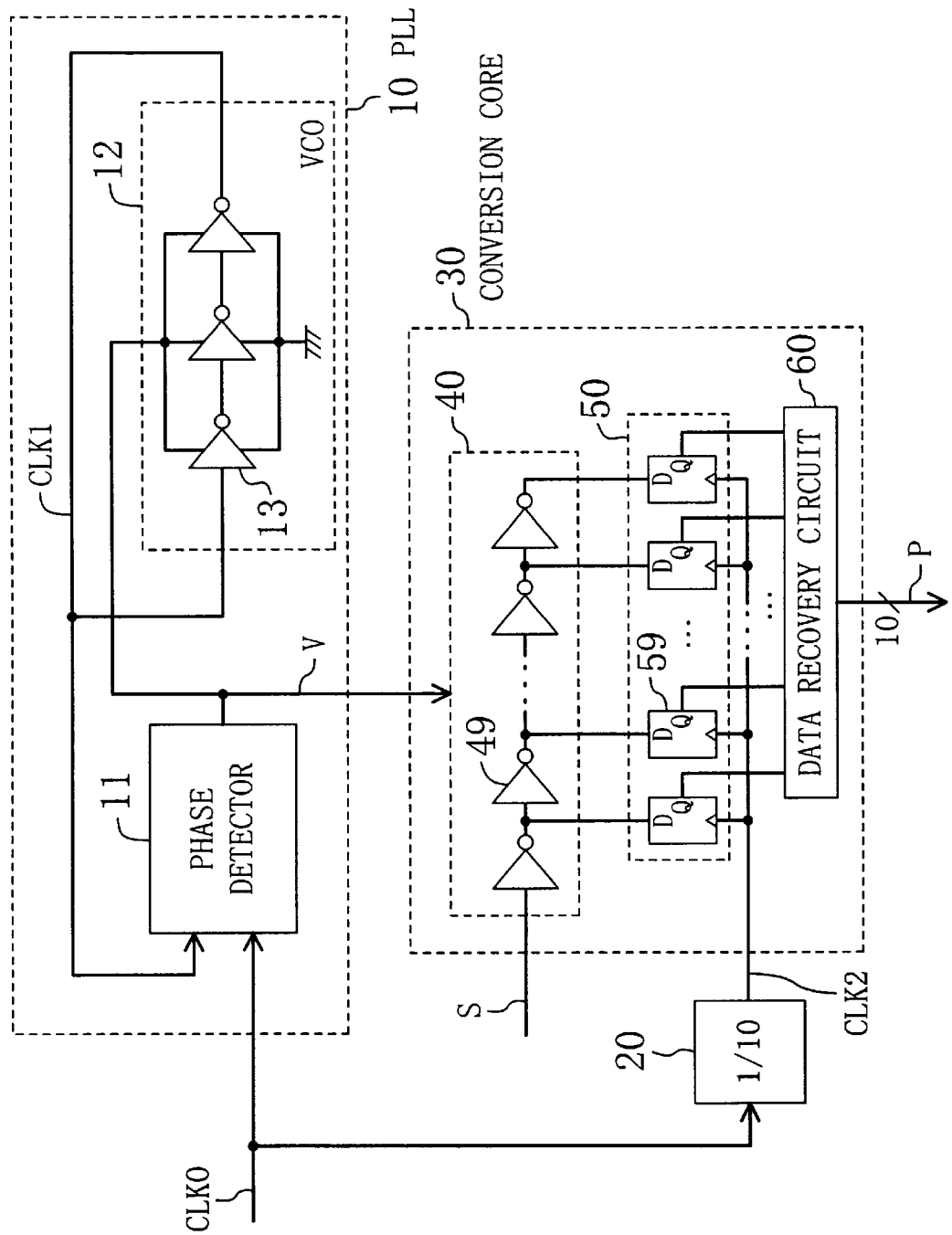
FIG. 1 is a block diagram illustrating an exemplary configuration for a serial-to-parallel converter according to the present invention.

FIG. 1 illustrates an exemplary configuration for a serial-to-parallel converter (SPC) according to the present invention. As shown in FIG. 1, the SPC includes a PLL 10, a frequency divider 20 and a conversion core 30.

The PLL 10 includes a phase detector 11 and a VCO 12. The phase detector 11 includes a phase comparator and a low-pass filter (neither is shown in FIG. 1). The detector 11 supplies a DC voltage (i.e., control voltage as defined in the claims), which is defined based on a phase difference between a reference clock signal CLK0 and an oscillation clock signal CLK1 of the VCO 12, to the VCO 12, thereby controlling the oscillation frequency of the VCO 12. In this illustrative example, the VCO 12 is a known ring oscillator, in which a plurality of inverters (i.e., exemplary logical elements as defined in the claims) 13 are connected together in a ring. A delay caused by each of these inverters 13 is controlled based on the DC voltage V. In this example, the frequency of the signal CLK0 is identified by Fr (Hz) and the number of inverters 13 is identified by Nv, which is an odd number equal to or larger than 3.

The conversion core 30 includes a delay circuit 40, a latch circuit 50 and a data recovery circuit 60, and converts a serial (S) signal into a parallel (P) signal. In the illustrated example, the bit rate of the S signal is identified by Rs (bps), the over sampling rate thereof is identified by So, and the bit width of the P signal is identified by Bp. The delay circuit 40 includes a plurality of inverters (i.e., exemplary delay devices as defined in the claims) 49 connected in series to each other. A delay caused by each of these inverters 49 is controlled with the same voltage as the control voltage V applied to the VCO 12. The S signal is input to the initial-stage one of the inverters 49. Each of the inverters 49 making up the delay circuit 40 has the same device configuration as each of the inverters 13 making up the VCO 12. In the illustrated example, the number of inverters 49 is identified by Nd, which is an integer larger than Nv. The latch circuit 50 includes the number Nd of D-type flip-flops (FFs) 59, and latches the respective output signals of the inverters 49 responsive to a latch clock signal CLK2. The signal CLK2 is generated by the frequency divider 20 from the signal CLK0. In the illustrated example, the frequency of the signal CLK2 is identified by Fl (Hz), where Fl<Fr. The data recovery circuit 60 performs a required parallel data recovery operation on the outputs of the latch circuit 50 in accordance with the over sampling rate So of the S signal, thereby generating and outputting a P signal with the bit width Bp. In this case, the following relationship $$Nd = Bp \times So \quad (1)$$

is met.

In the SPC shown in FIG. 1, the phase detector 11 regulates the control voltage V so as to equalize the frequency of the signal CLK1 with the frequency Fr of the signal CLK0. Accordingly, so long as the frequency Fr of the signal CLK0 is constant, the frequency of the signal CLK1 is also kept constant even if a power supply voltage or temperature has varied. In this case, a delay caused by each inverter stage of the VCO 12 is obtained by 1/(Fr×Nv). A delay caused by each inverter stage of the delay circuit 40 is also obtained by 1/(Fr×Nv). Accordingly, the total delay caused by the delay circuit 40 is Nd/(Fr×Nv). The period of the signal CLK2, i.e., 1/Fl, is set equal to this total delay. That is to say, $$Fl = Fr \times (Nv/Nd) \quad (2)$$

In this case, it is supposed that Rs=1 Gbps and Fr=1 GHz. That is to say, Rs=Fr. Accordingly, the following relationship $$Fl = Rs \times (Nv/Nd) = Rs \times Nv/(Bp \times So) \quad (3)$$

is derived from Equations (1) and (2). In other words, the period of the signal CLK2, i.e., 1/Fl, is determined in accordance with the bit rate Rs of the S signal and the bit width Bp of the P signal. Specifically, if Bp=10 and So=3, then Nv=3, Nd=30 and Fl=100 MHz. In this case, a delay caused by each inverter stage of the VCO 12 and the delay circuit 40 is one-third nanosecond, the total delay caused by the delay circuit 40 is 10 ns and the division ratio of the frequency divider 20 is 1/10. The data recovery circuit 60 performs a majority logical operation on a three-bit basis, thereby generating a P signal with a width of 10 bits from a parallel signal with a width of 30 bits. As a result, the P signal with a width of 10 bits is output from the SPC shown in FIG. 1 every 10 nanoseconds responsive to the S signal supplied at a bit rate of 1 Gbps.

The inverters 13 and 49 shown in FIG. 1, each causing just a short delay, are easily implementable even by a CMOS process. In addition, there is no need to supply a shift clock signal to the delay circuit 40. Thus, the SPC shown in FIG. 1 can operate at a higher speed and with greater reliability without using a shift register.

It should be noted that another frequency divider may be provided for at least one of the two inputs of the phase detector 11. Also, the control voltage V applied to the VCO 12 may be converted into a digital quantity and then the digital quantity may be transmitted to the conversion core 30. Furthermore, the number of inverters 49 making up the delay circuit 40 may be twice as large as that of FFs 59 making up the latch circuit 50 such that the output signal of every other inverter 49 is latched.

Figure 2:
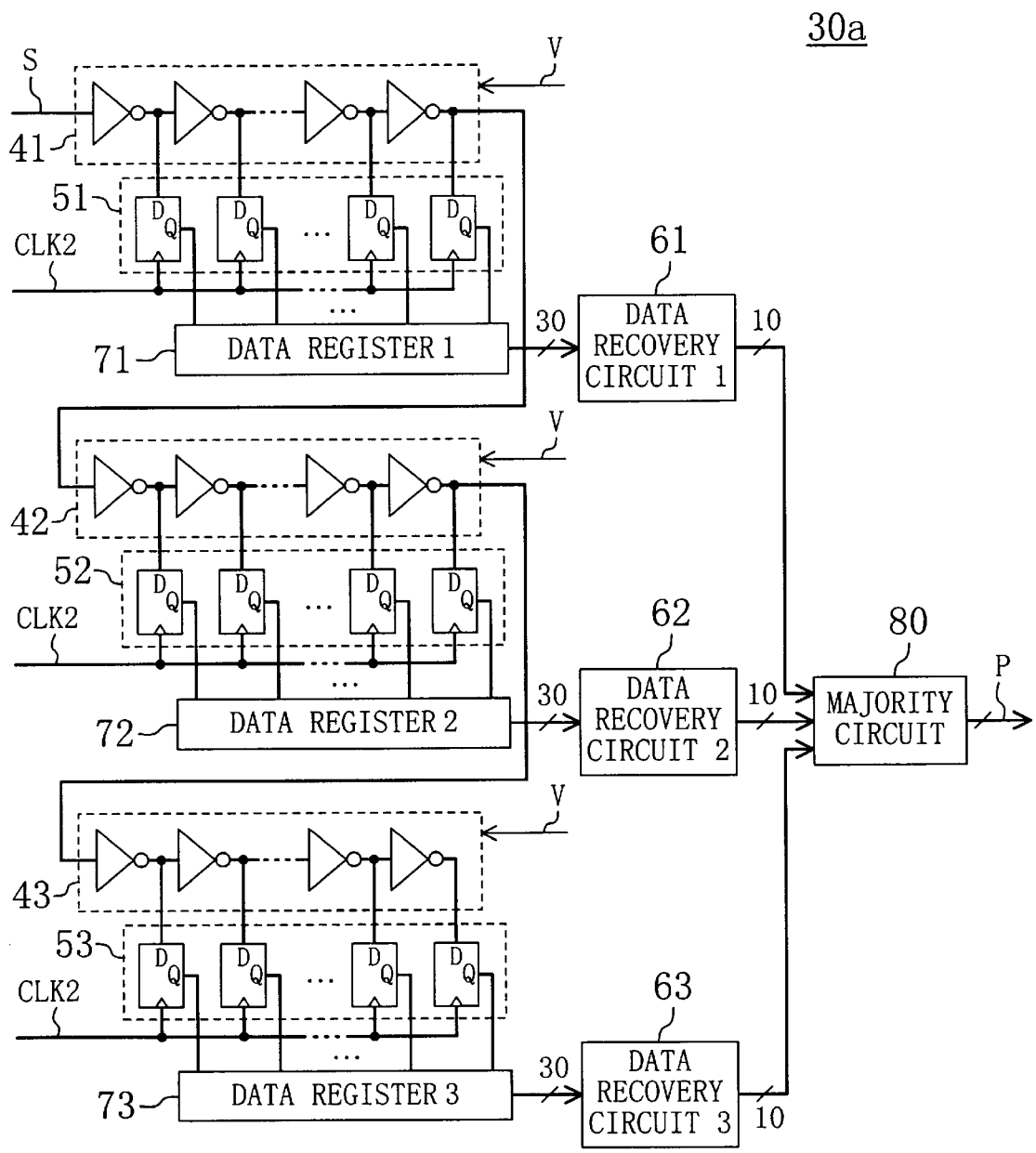
FIG. 2 is a block diagram illustrating a modified example of the conversion core shown in FIG. 1.

FIG. 2 illustrates a modified example of the conversion core 30 shown in FIG. 1. A conversion core 30a shown in FIG. 2 includes: first, second and third delay circuits 41, 42, 43; first, second and third latch circuits 51, 52, 53; first, second and third data recovery circuits 61, 62, 63; first, second and third data registers 71, 72, 73; and a majority circuit 80. The first data register 71 is interposed between the first latch circuit 51 and the first data recovery circuit 61. The second data register 72 is interposed between the second latch circuit 52 and the second data recovery circuit 62. And the third data register 73 is interposed between the third latch circuit 53 and the third data recovery circuit 63. The conversion core 30a also converts an S signal with a bit rate of 1 Gbps into a P signal with a width of 10 bits. As in the specific example described with reference to FIG. 1, the over sampling rate of the S signal is supposed to be 3 and the frequency of the signal CLK2 100 MHz. Also, a PLL for supplying the control voltage V to the conversion core 30a also includes a VCO, in which three inverters are connected together in a ring, and receives the signal CLK0 at a frequency of 1 GHZ.

In FIG. 2, the first delay circuit 41 is made up of thirty inverters, which are connected in series to each other and each of which has its delay controlled by the control voltage V. The S signal is input to the initial-stage one of the inverters. The first latch circuit 51 includes thirty FFs and latches the output signals of the respective inverters in the first delay circuit 41 responsive to the signal CLK2. The first data register 71 temporarily stores thereon a parallel signal with a width of 30 bits, which has been supplied from the first latch circuit 51. The first data recovery circuit 61 performs a majority logical operation on a three-bit basis, thereby generating a parallel signal with a width of 10 bits from the parallel signal with a width of 30 bits that has been temporarily stored on the first data register 71. The second delay circuit 42 is made up of thirty inverters, which are connected in series to each other and each of which has its delay controlled by the control voltage V. The output signal of the final-stage inverter of the first delay circuit 41 is input to the initial-stage one of these inverters. The second latch circuit 52 includes thirty FFs and latches the output signals of the respective inverters of the second delay circuit 42 responsive to the signal CLK2. The second data register 72 temporarily stores thereon a parallel signal with a width of 30 bits, which has been supplied from the second latch circuit 52. The second data recovery circuit 62 performs a majority logical operation on a three-bit basis, thereby generating a parallel signal with a width of 10 bits from the parallel signal with a width of 30 bits that has been temporarily stored on the second data register 72. The third delay circuit 43 is made up of thirty inverters, which are connected in series to each other and each of which has its delay controlled by the control voltage V. The output signal of the final-stage inverter of the second delay circuit 42 is input to the initial-stage one of these inverters. The third latch circuit 53 includes thirty FFs and latches the output signals of the respective inverters of the third delay circuit 43 responsive to the signal CLK2. The third data register 73 temporarily stores thereon a parallel signal with a width of 30 bits, which has been supplied from the third latch circuit 53. The third data recovery circuit 63 performs a majority logical operation on a three-bit basis, thereby generating a parallel signal with a width of 10 bits from the parallel signal with a width of 30 bits that has been temporarily stored on the third data register 73. The majority circuit 80 performs a majority logical operation on a bit-by-bit basis, thereby generating a P signal with a width of 10 bits from the respective 10-bit parallel signals, which have been generated by the first, second and third data recovery circuits 61, 62 and 63, and outputting the P signal.

In the conversion core 30a shown in FIG. 2, each data bit in the S signal is latched three times while the signal is passing through the first, second and third delay circuits 41, 42 and 43. Then, the results of these latching operations performed three times are subjected to majority logical operation. Thus, an even more probable P signal is obtained.

In the specific example described with reference to FIG. 1, the total delay caused by the delay circuit 40 is 10 ns and the latch circuit 50 performs latching at an interval of 10 ns in response to the signal CLK2 with a frequency of 100 MHz. Accordingly, if the total delay deviates from the latching interval, or vice versa, then the serial-to-parallel conversion cannot be performed correctly. For example, if the latching interval gets longer by one-third nanosecond due to noise, then one data bit in the S signal is not latched but missed. Also, if such a mismatch state lasts long, then the latch misses accumulate, thus deteriorating the precision of conversion. Exemplary measures taken to solve these problems will be described below.

Figure 3:
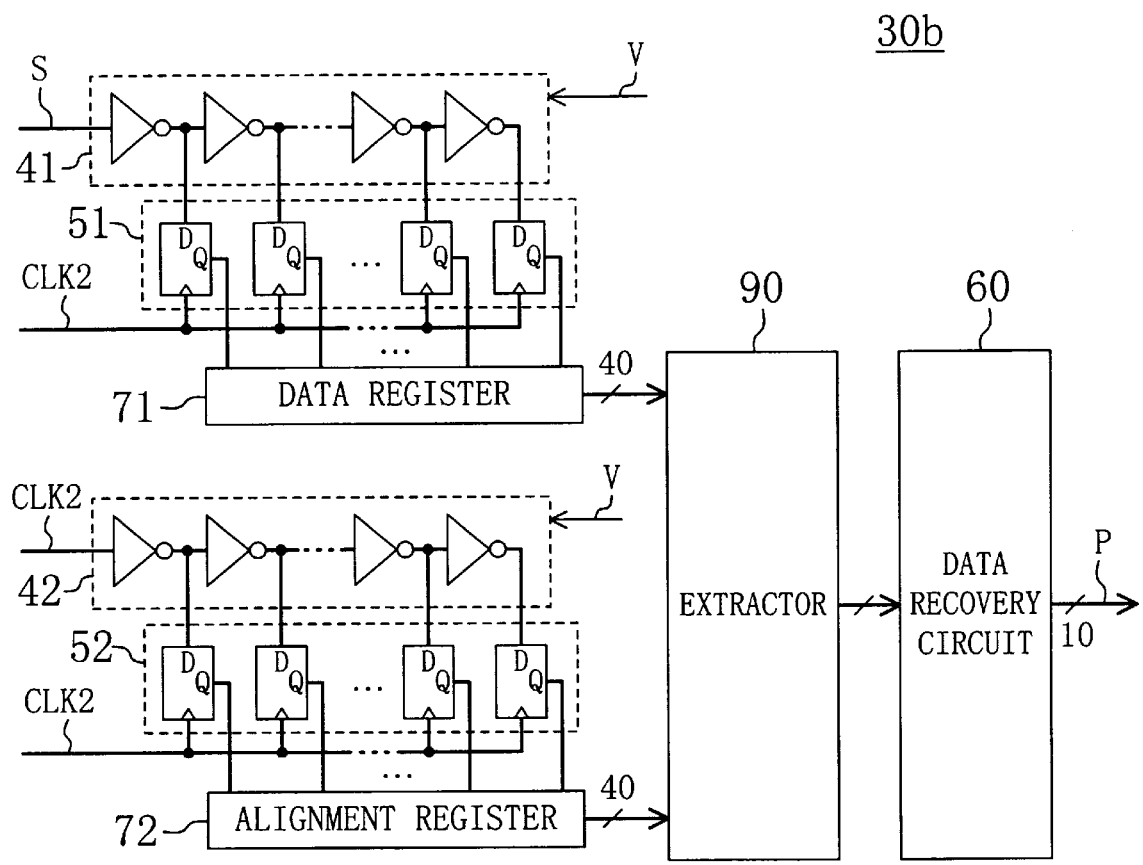
FIG. 3 is a block diagram illustrating another modified example of the conversion core shown in FIG. 1.

FIG. 3 illustrates another modified example of the conversion core 30 shown in FIG. 1. A conversion core 30b shown in FIG. 3 includes: first and second delay circuits 41, 42; first and second latch circuits 51, 52; a data register 71; an alignment register 72; a data recovery circuit 60; and an extractor 90 interposed between the registers 71, 72 and the data recovery circuit 60. The conversion core 30b also converts an S signal with a bit rate of 1 Gbps into a P signal with a width of 10 bits. As in the specific example described with reference to FIG. 1, the over sampling rate of the S signal is supposed to be 3 and the frequency of the signal CLK2 100 MHz. Also, a PLL for supplying the control voltage V to the conversion core 30b also includes a VCO, in which three inverters are connected together in a ring, and receives the signal CLK0 at a frequency of 1 GHz.

In FIG. 3, the first delay circuit 41 is made up of forty inverters, which are connected in series to each other and each of which has its delay controlled by the control voltage V. The S signal is input to the initial-stage one of these inverters. The first latch circuit 51 includes forty FFs and latches the output signals of the respective inverters in the first delay circuit 41 responsive to the signal CLK2. The data register 71 temporarily stores thereon a parallel signal (i.e., input data) with a width of 40 bits, which has been supplied from the first latch circuit 51. The second delay circuit 42 is made up of forty inverters, which are connected in series to each other and each of which has its delay controlled by the control voltage V. The signal CLK2 is input to the initial-stage one of these inverters. The second latch circuit 52 includes forty FFs and latches the output signals of the respective inverters in the second delay circuit 42 responsive to the signal CLK2. The alignment register 72 is a data register for temporarily storing thereon a parallel signal (i.e., clock data) with a width of 40 bits, which has been supplied from the second latch circuit 52. The extractor 90 extracts data, corresponding to one period of the signal CLK2, from the input data that is temporarily stored on the data register 71 based on the clock data stored on the alignment register 72, and passes the extracted data to the data recovery circuit 60. The data supplied to the data recovery circuit 60 is ordinarily composed of 30 bits. The data recovery circuit 60 basically performs a majority logical operation on a three-bit basis, thereby generating a P signal with a width of 10 bits from the 30-bit data and outputting the P signal.

Figure 4:
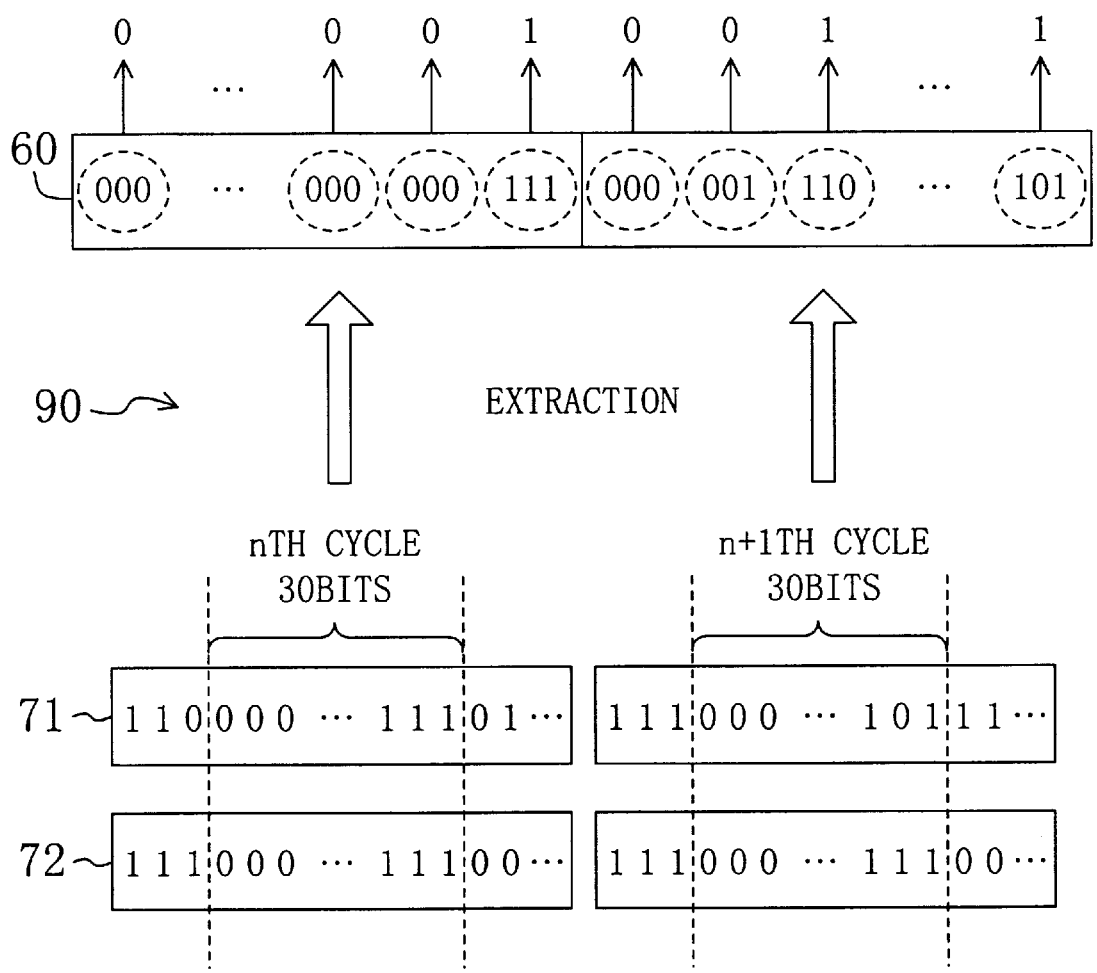
FIG. 4 is a schematic illustrating the operations of respective circuit blocks shown in FIG. 3.

FIG. 4 is a schematic illustrating the operations of respective circuit blocks shown in FIG. 3. The clock data stored on the alignment register 72 represents the waveform of the signal CLK2. For example, the transition of a clock data bit from "1" into "0" represents a trailing edge of the signal CLK2, while the transition of a clock data bit from "0" into "1" represents a leading edge of the signal CLK2. Accordingly, the extractor 90 can determine based on the clock data stored on the alignment register 72 how many bits are equivalent to one period of the signal CLK2. In the example illustrated in FIG. 4, 30 bits are extracted at an $n^{th}$ cycle by the extractor 90 from the input data temporarily stored on the data register 71, and are supplied to the data recovery circuit 60. The same operation is performed at an $(n+1)^{th}$ cycle.

If one period of the signal CLK2 has got longer than 10 ns by one-third nanosecond for some cause or other, then the extractor 90 extracts 31 bits from the input data temporarily stored on the data register 71 and passes the extracted 31 bits to the data recovery circuit 60. The data recovery circuit 60 recovers a number Ma (which is an integer equal to or larger than 1) of "0" bits from a number 3Ma+1 of consecutive "0" bits included in the 31 bits supplied. Alternatively, the data recovery circuit 60 recovers the number Ma of "1" bits from the number 3Ma+1 of consecutive "1" bits included in the 31 bits supplied. Then, the data recovery circuit 60 performs a majority logical operation on a three-bit basis, thereby generating a P signal with a width of 10 bits from the remaining bits. That is to say, even if one period of the signal CLK2 has got longer than 10 ns, serial-to-parallel conversion can be performed correctly without missing any input bit. For instance, if 29 bits have been extracted, a number Mb (which is an integer equal to or larger than 1) of "0" 1 bits are recovered from a number 3Mb−1 of consecutive "0" bits or the number Mb of "1" bits are recovered from the number 3Mb−1 of consecutive "1", bits. And then a majority logical operation is performed on the remaining bits on a three-bit basis.

It should be noted that a conversion core as a combination of the configurations shown in FIGS. 2 and 3 may also be used.

What is claimed is:

1. A serial-to-parallel converter for converting a serial signal with a predetermined bit rate into a parallel signal with a predetermined bit width, the serial-to-parallel converter comprising:

a phase locked loop including
a voltage controlled oscillator made up of a plurality of logical elements connected together in a ring, and
a phase detector for supplying a control voltage to each said logical element so as to control an oscillation frequency of the voltage controlled oscillator, the control voltage being defined based on a phase difference between a reference clock signal and an oscillation signal of the voltage controlled oscillator;

a delay circuit made up of a plurality of delay devices connected in series to each other, a delay caused by each said delay device being controlled with the same voltage as the control voltage, the serial signal being input to an initial-stage one of the delay devices; and a latch circuit for latching part or all of output signals of the delay devices in response to a latch clock signal and for outputting the parallel signal based on a result of latching.

2. The serial-to-parallel converter of claim 1, wherein a period of the latch clock signal is determined based on the bit rate of the serial signal and the bit width of the parallel signal.

3. The serial-to-parallel converter of claim 1, wherein a period of the latch clock signal is equal to a total delay caused by the delay circuit.

4. The serial-to-parallel converter of claim 1, further comprising a data recovery circuit for performing a required parallel data recovery operation on the output of the latch circuit in accordance with an over sampling rate of the serial signal.

5. A serial-to-parallel converter for converting a serial signal with a predetermined bit rate into a parallel signal with a predetermined bit width, the serial-to-parallel converter comprising:

a phase locked loop including
a voltage controlled oscillator made up of a plurality of logical elements connected together in a ring, and
a phase detector for supplying a control voltage to each said logical element so as to control an oscillation frequency of the voltage controlled oscillator, the control voltage being defined based on a phase difference between a reference clock signal and an oscillation signal of the voltage controlled oscillator;

a first delay circuit made up of a plurality of delay devices connected in series to each other, a delay caused by each said delay device being controlled with the same voltage as the control voltage, the serial signal being input to an initial-stage one of the delay devices;

a first latch circuit for latching output signals of the delay devices of the first delay circuit in response to a latch clock signal;

a second delay circuit made up of a plurality of delay devices connected in series to each other, a delay caused by each said delay device being controlled with the same voltage as the control voltage, an output signal of a final-stage one of the delay devices of the first delay circuit being input to an initial-stage one of the delay devices of the second delay circuit;

a second latch circuit for latching output signals of the delay devices of the second delay circuit in response to the latch clock signal;

a third delay circuit made up of a plurality of delay devices connected in series to each other, a delay caused by each said delay device being controlled with the same voltage as the control voltage, an output signal of a final-stage one of the delay devices of the second delay circuit being input to an initial-stage one of the delay devices of the third delay circuit;

a third latch circuit for latching output signals of the delay devices of the third delay circuit in response to the latch clock signal; and a majority circuit for outputting the parallel signal based on respective results of latching performed by the first, second and third latch circuits.

6. The serial-to-parallel converter of claim 5, wherein a period of the latch clock signal is determined based on the bit rate of the serial signal and the bit width of the parallel signal.

7. The serial-to-parallel converter of claim 5, wherein a period of the latch clock signal is equal to a total delay caused by each of the first, second and third delay circuits.

8. The serial-to-parallel converter of claim 5, further comprising a data recovery circuit for performing a required parallel data recovery operation on the output of each of the first, second and third latch circuits in accordance with an over sampling rate of the serial signal.

9. A serial-to-parallel converter for converting a serial signal with a predetermined bit rate into a parallel signal with a predetermined bit width, the serial-to-parallel converter comprising:

a phase locked loop including a voltage controlled oscillator made up of a plurality of logical elements connected together in a ring, and a phase detector for supplying a control voltage to each said logical element so as to control an oscillation frequency of the voltage controlled oscillator, the control voltage being defined based on a phase difference between a reference clock signal and an oscillation signal of the voltage controlled oscillator;

a first delay circuit made up of a plurality of delay devices connected in series to each other, a delay caused by each said delay device being controlled with the same voltage as the control voltage, the serial signal being input to an initial-stage one of the delay devices;

a first latch circuit for latching output signals of the delay devices of the first delay circuit in response to a latch clock signal;

a second delay circuit made up of a plurality of delay devices connected in series to each other, a delay caused by each said delay device being controlled with the same voltage as the control voltage, the latch clock signal being input to an initial-stage one of the delay devices of the second delay circuit;

a second latch circuit for latching output signals of the delay devices of the second delay circuit in response to the latch clock signal; and an extractor for extracting data corresponding to one period of the latch clock signal from a result of latching performed by the first latch circuit based on a result of latching performed by the second latch circuit, and for outputting the parallel signal based on the data extracted.

10. The serial-to-parallel converter of claim 9, wherein a period of the latch clock signal is shorter than a total delay caused by each of the first and second delay circuits.

11. The serial-to-parallel converter of claim 9, further comprising a data recovery circuit for performing a required parallel data recovery operation on the output of the extractor in accordance with an over sampling rate of the serial signal.

12. The serial-to-parallel converter of claim 11, wherein the number of delay devices in each of the first and second delay circuits is larger than a product obtained by multiplying together the bit width of the parallel signal and the over sampling rate of the serial signal.

* * * * *